(12) United States Patent
Kim et al.

(10) Patent No.: US 7,608,509 B2
(45) Date of Patent: Oct. 27, 2009

(54) METHOD OF MANUFACTURING A FLASH MEMORY DEVICE HAVING COMPENSATION MEMBERS FORMED ON EDGE PORTIONS OF A TUNNEL OXIDE LAYER

(75) Inventors: Chul-Sung Kim, Seongnam-si (KR); Yu-Gyun Shin, Seongnam-si (KR); Bon-Young Koo, Suwon-si (KR); Sung-Kweon Baek, Suwon-si (KR); Young-Jin Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 348 days.

(21) Appl. No.: 11/494,439

(22) Filed: Jul. 27, 2006

(65) Prior Publication Data

US 2007/0023821 A1 Feb. 1, 2007

(30) Foreign Application Priority Data

Aug. 1, 2005 (KR) .............. 10-2005-0070189

(51) Int. Cl.
*H01L 21/336* (2006.01)
*H01L 29/788* (2006.01)

(52) U.S. Cl. .............. 438/265; 438/296; 438/594; 257/E27.103

(58) Field of Classification Search .......... 257/E27.102, 257/E27.103; 438/201, 257, 265, 296, 594
See application file for complete search history.

(56) References Cited

U.S. PATENT DOCUMENTS

| | | | | |
|---|---|---|---|---|
| 5,104,819 A | * | 4/1992 | Freiberger et al. | 438/593 |
| 5,698,879 A | * | 12/1997 | Aritome et al. | 257/315 |
| 6,222,224 B1 | * | 4/2001 | Shigyo | 257/315 |
| 6,281,050 B1 | * | 8/2001 | Sakagami | 438/142 |
| 6,476,438 B2 | * | 11/2002 | Shimizu | 257/314 |
| 6,551,948 B2 | * | 4/2003 | Ohmi et al. | 438/778 |
| 6,555,434 B2 | * | 4/2003 | Koh | 438/257 |
| 6,620,681 B1 | * | 9/2003 | Kim et al. | 438/257 |
| 6,743,675 B2 | * | 6/2004 | Ding | 438/257 |
| 6,818,508 B2 | * | 11/2004 | Shimizu et al. | 438/257 |
| 7,250,651 B2 | * | 7/2007 | Kusters et al. | 257/315 |

(Continued)

FOREIGN PATENT DOCUMENTS

JP 11-017033 1/1999

(Continued)

*Primary Examiner*—Anh D Mai
(74) *Attorney, Agent, or Firm*—Mills & Onello LLP

(57) ABSTRACT

In a semiconductor device and a method of manufacturing the semiconductor device, preliminary isolation regions having protruded upper portions are formed on a substrate to define an active region. After an insulation layer is formed on the active region, a first conductive layer is formed on the insulation layer. The protruded upper portions of the preliminary isolation regions are removed to form isolation regions on the substrate and to expose sidewalls of the first conductive layer, and compensation members are formed on edge portions of the insulation layer. The compensation members may complement the edge portions of the insulation layer that have thicknesses substantially thinner than that of a center portion of the insulation layer, and may prevent deterioration of the insulation layer. Furthermore, the first conductive layer having a width substantially greater than that of the active region may enhance a coupling ratio of the semiconductor device. Thus, the semiconductor device may have improved electrical characteristics and reliability.

14 Claims, 7 Drawing Sheets

U.S. PATENT DOCUMENTS

| | | | |
|---|---|---|---|
| 7,445,997 B2* | 11/2008 | Lee et al. | 438/260 |
| 2002/0072197 A1* | 6/2002 | Kang et al. | 438/424 |
| 2005/0136601 A1* | 6/2005 | Jang et al. | 438/296 |
| 2007/0026633 A1* | 2/2007 | Lee | 438/424 |

FOREIGN PATENT DOCUMENTS

| | | |
|---|---|---|
| KR | 10-0284140 | 12/2000 |
| KR | 10-2001-0003787 | 1/2001 |
| KR | 10-0466189 | 1/2005 |
| KR | 10-0466195 | 1/2005 |
| KR | 10-2005-0030008 | 3/2005 |

\* cited by examiner

METHOD OF MANUFACTURING A FLASH MEMORY DEVICE HAVING COMPENSATION MEMBERS FORMED ON EDGE PORTIONS OF A TUNNEL OXIDE LAYER

CROSS REFERENCE TO RELATED APPLICATIONS

This application claims priority under 35 U.S.C. § 119 to Korean Patent Application No. 2005-70189 filed on Aug. 1, 2005, the contents of which are herein incorporated by reference in their entirety.

BACKGROUND OF THE INVENTION

1. Field of the Invention

The present invention relates to a semiconductor device and a method of manufacturing the semiconductor device. More particularly, example embodiments of the present invention relate to a semiconductor device having enhanced characteristics through compensating edge portions of an insulation layer and a method of manufacturing the same.

2. Description of the Related Art

Semiconductor devices are generally divided into volatile semiconductor memory devices and nonvolatile semiconductor memory devices. The volatile semiconductor memory devices such as dynamic random-access memory (DRAM) devices or static random-access memory (SRAM) devices lose data stored therein when power is turned off, and thus have some limitations in use. However, the nonvolatile semiconductor memory devices can maintain data stored therein even after power is turned off. Thus, the nonvolatile semiconductor memory devices such as a flash memory device have been greatly in demand. The flash memory device is electrically erasable and programmable.

The flash memory device includes a memory cell for storing data that has a stacked gate structure. In particular, the memory cell includes a tunnel oxide layer formed on a semiconductor substrate including an isolation layer, a floating gate formed on the tunnel oxide layer, a dielectric layer formed on the floating gate, and a control gate formed on the dielectric layer. The flash memory device stores data by controlling the number of electrons placed on the floating gate of the memory cell. The number of electrons on the floating gate is varied by properly applying power to the control gate and the semiconductor substrate. The dielectric layer serves to maintain the electrons accumulated in the floating gate, and to convey power applied to the control gate to the floating gate.

In a method of manufacturing a conventional nonvolatile memory device, a tunnel oxide layer and a floating gate are successively formed on a semiconductor substrate on which an isolation layer is formed. The tunnel oxide layer and the floating gate are formed on an active region of the semiconductor substrate by a photolithography process. In the photolithography process, the floating gate and the active region may be misaligned. As a line width of the nonvolatile memory device is reduced, there are limitations in ensuring an alignment error margin between the floating gate and the active region.

To solve the above problems, a new method of manufacturing the nonvolatile memory device has been developed as disclosed in Korean Laid-Open Patent Publication No. 2005-30008. In the method, a floating gate of the nonvolatile memory device is formed by a self-alignment process, in which the floating gate is self-aligned relative to isolation regions having protruded upper portions. Particularly, a mask pattern having a predetermined thickness is formed on a semiconductor substrate. Trenches are formed on the semiconductor substrate using the mask pattern. The trenches are filled with an insulation material up to an upper face of the mask pattern. As a result, isolation regions having protruded upper portions are formed on the semiconductor substrate to define an active region and a field region in the semiconductor substrate. The mask pattern is removed from the semiconductor substrate to form an opening that exposes the active region of the semiconductor substrate between the isolation regions. A tunnel oxide layer is formed on a bottom of the opening. The floating gate is formed on the tunnel oxide layer to fill up the opening.

In a process of removing the mask pattern, the protruded upper portions of the isolation regions are partially etched so that the opening has a width substantially wider than that of the active region. Thus, the tunnel oxide layer and the floating gate have widths substantially wider than that of the active region. The tunnel oxide layer is also formed on edge portions of the active region. The edge portions of the active region are affected by concentrated stress so that the tunnel oxide formed on the edge portions of the active region has a thickness substantially thinner than that of the tunnel oxide layer formed on a center portion of the active region. When the tunnel oxide layer has a partially thin portion, a Fowler-Nordheim (F-N) tunneling through the tunnel oxide layer is concentrated on the thin portion of the tunnel oxide layer. Thus, electrical characteristics of the nonvolatile memory device are deteriorated. Furthermore, the electrons on the floating gate easily leak through the thin portion of the tunnel oxide layer. Therefore, reliability of the nonvolatile memory device is also reduced.

To prevent thinning of a tunnel oxide layer and to form the tunnel oxide layer having a uniform thickness, some methods have been developed. Korean Patent No. 466,195 discloses a method of prevent thinning of the tunnel oxide layer by controlling an edge profile of a trench for forming an isolation layer on a semiconductor substrate. The trench of which edge portion has a double profile is formed by properly etching a mask pattern formed on the semiconductor substrate and the semiconductor substrate, and by forming a sacrificial oxide layer on a sidewall of the trench. As a result, generation of a moat on an edge portion of the tunnel oxide layer and thinning of the tunnel oxide layer are prevented. Korean Patent No. 466,189 discloses a method of preventing thinning of the tunnel oxide layer by rounding an edge portion of a trench for forming an isolation layer at a semiconductor substrate. The edge portion of the trench is rounded by an annealing process under a hydrogen atmosphere. In the above methods, thinning of the tunnel oxide layer is prevented by improving a structure of a trench for forming an isolation layer.

Korean Patent No. 284,140 discloses a re-oxidation process for thickening edge portions of a tunnel oxide layer and a floating gate after a formation of a gate structure including the tunnel oxide layer, the floating gate, a dielectric layer and a control gate on a semiconductor substrate. In the method, the dielectric layer and the control gate are also oxidized in the re-oxidation process. For example, when the control gate is formed by using a metal such as tungsten, the control gate is oxidized in the re-oxidation process so that electrical characteristics of the control gate are greatly deteriorated.

Japanese Laid-Open Patent Publication No. 11-17033 discloses a method of forming a flash memory device. In the method, an isolation layer is formed on a semiconductor substrate, and then a tunnel oxide layer is formed on the semiconductor substrate. A polysilicon layer that serves as a floating gate is formed on the tunnel oxide layer. After impurities are implanted into the polysilicon layer by an ion implantation process, the polysilicon layer is oxidized to form an oxide layer on the polysilicon layer. The oxidation process just serves to control a thickness of the polysilicon layer and to form the polysilicon having a uniform thickness, not to prevent thinning of the tunnel oxide layer.

SUMMARY OF THE INVENTION

Example embodiments of the present invention provide a semiconductor device having enhanced characteristics using compensation members that complement edge portions of an insulation layer.

Example embodiments of the present invention provide a method of manufacturing a semiconductor device having enhanced characteristics using compensation members that complement edge portions of an insulation layer.

According to one aspect of the present invention, a semiconductor device comprises a substrate having an active region, an insulation layer formed on the active region, compensation members formed on the edge portions of the insulation layer and a first conductive layer formed on the insulation layer. The insulation layer includes a center portion having a first thickness and edge portions each having a second thickness. The first thickness of the center portion of the insulation layer may be substantially the same as or thicker than the second thickness of the edge portions of the insulation layer.

In one embodiment of the present invention, each of the compensation members may have a third thickness. A sum of the second thickness and the third thickness may be substantially greater than the first thickness. Each of the compensation members may include an insulation material. Each of the compensation members may include oxide that is formed by an oxidation of a lower edge portion of the first conductive layer.

In another embodiment of the present invention, the insulation layer may include oxide.

In another embodiment of the present invention, the first conductive layer may include polysilicon doped with impurities. The first conductive layer may have a width substantially greater than that of the active region.

In another embodiment of the present invention, the semiconductor device may further include a dielectric layer formed on the first conductive layer and a second conductive layer formed on the dielectric layer. The dielectric layer may have an oxide/nitride/oxide (ONO) structure. The second conductive layer may include metal, metal silicide, conductive metal nitride or polysilicon doped with impurities.

According to another aspect, the present invention is directed to a semiconductor device comprising a substrate including an active region and an isolation region, an insulation layer formed on the active region, the insulation layer including a center portion having a first thickness and edge portions having a second thickness, compensation members formed on the edge portions of the insulation layer, and a first conductive layer formed on the insulation layer. The insulation layer and the first conductive layer have a width substantially greater than that of the active region so that edge portions of the insulation layer and the first conductive layer extend to the isolation region. The first thickness of the center portion of the insulation layer may be equal to or thicker than the second thickness of the edge portions of the insulation layer.

In one embodiment of the present invention, the compensation members may have a third thickness, and a sum of the second thickness and the third thickness may be substantially greater than the first thickness.

According to another aspect of the present invention, there is provided a method of manufacturing a semiconductor device. According to the method, preliminary isolation regions are formed on a substrate to define an active region. The preliminary isolation regions have protruded upper portions. An insulation layer is formed on the active region. A first conductive layer is formed on the insulation layer. The protruded upper portions of the preliminary isolation regions are removed to expose sidewalls of the first conductive layer. Compensation members are formed on edge portions of the insulation layer.

In one embodiment of the present invention, the preliminary isolation regions may be formed by successively forming a pad oxide layer and a mask layer on the substrate, by partially etching the mask layer and the pad oxide layer to form a pad oxide layer pattern and a mask pattern on the substrate and to expose portions of the substrate, by partially etching the exposed portions of the substrate to form trenches on the substrate, by filling a preliminary isolation layer into the trenches to form the preliminary isolation regions, and by removing the mask pattern and the pad oxide layer pattern to form an opening exposing the active region between the preliminary isolation regions.

In another embodiment of the present invention, the opening may be enlarged so that the opening has a width substantially greater than that of the active region. The insulation layer formed on a bottom of the opening may have a width substantially greater than that of the active region.

In another embodiment of the present invention, the first conductive layer may be formed by a self-alignment process. The first conductive layer may be self-aligned relative to the preliminary isolation regions. The first conductive layer may have a width substantially greater than that of the active region.

In another embodiment of the present invention, each of the compensation members may be formed by an oxidation of a lower edge portion of the first conductive layer.

In another embodiment of the present invention, the compensation members may be formed by a dry oxidation process or a wet oxidation process.

In another embodiment of the present invention, the compensation members may be formed by a thermal oxidation process, a radical oxidation process or a plasma oxidation process. The thermal oxidation process and the radical oxidation process may be performed at a temperature of about 800° C. to about 1,100° C. The plasma oxidation process may be performed at a temperature of about 350° C. to about 800° C.

In another embodiment of the present invention, the compensation members may be formed using a batch-type oxidation apparatus or a single-type oxidation apparatus.

In another embodiment of the present invention, a first oxide film may be formed on the first conductive layer. The compensation members and the first oxide film may be simultaneously formed.

In another embodiment of the present invention, a dielectric layer may be formed on the first conductive layer, and then a second conductive layer may be formed on the dielectric layer. The dielectric layer may be formed by forming a nitride film on the first oxide film and by forming a second oxide film on the nitride film. The first oxide film may be removed before a formation of the dielectric layer.

According to the present invention, the compensation members formed on the edge portions of the insulation layer may prevent the insulation layer from being deteriorated. The first conductive layer having a width substantially greater than that of the active region may enhance a coupling ratio of the semiconductor device. Therefore, the semiconductor device may have greatly improved electrical characteristics and reliability.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF EXAMPLE EMBODIMENTS OF THE INVENTION

Figure 1:
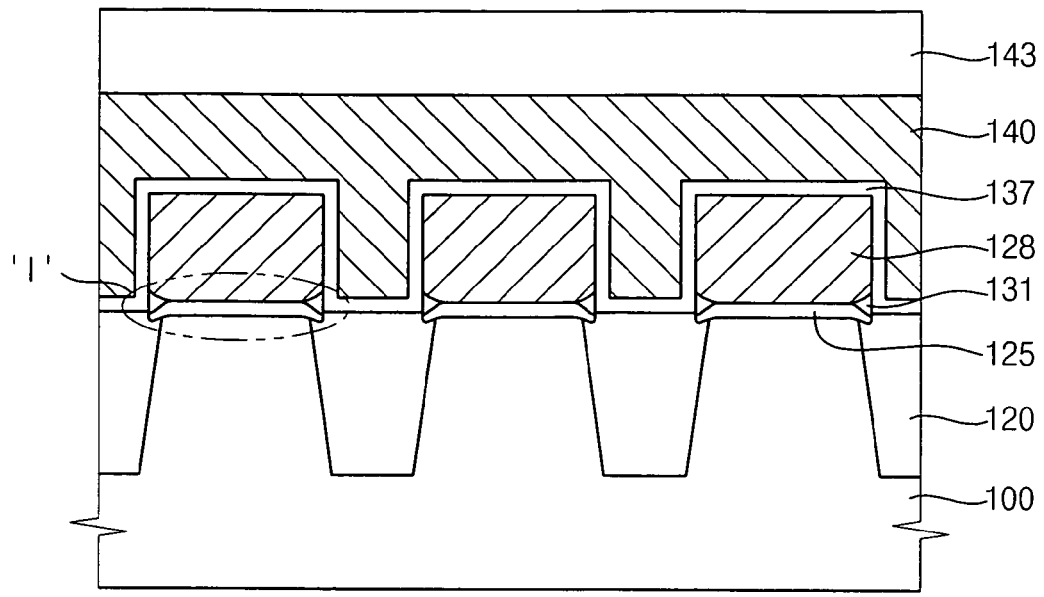
FIG. 1 is a cross-sectional view illustrating a semiconductor device in an example embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to unimplanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Semiconductor Device

Figure 2:
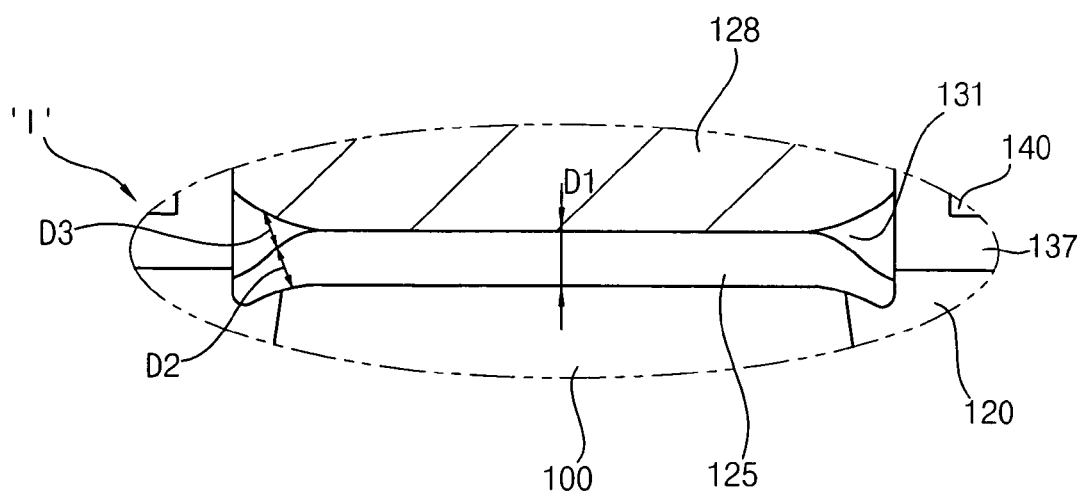
FIG. 2 is a partially enlarged cross-sectional view illustrating a portion of "I" in FIG. 1.

FIG. 1 is a cross-sectional view illustrating a semiconductor device in an example embodiment of the present invention. FIG. 2 is a partially enlarged cross-sectional view illustrating a portion of "I" in FIG. 1.

Referring to FIG. 1, the semiconductor device includes a substrate 100 having an active region defined by isolation regions 120, an insulation layer 125 formed on the active region, compensation members 131 formed on edge portions of the insulation layer 125 and a first conductive layer 128 formed on the insulation layer 125.

The isolation regions 120 are formed on the substrate 100 to define the active region of the substrate 100. Examples of the substrate 100 may include a silicon wafer or a silicon-on-insulator (SOI) substrate. The isolation regions may include an insulation material such as oxide.

The insulation layer 125 is formed on the active region of the substrate 100. The insulation layer 125 may be provided as a tunnel oxide layer of a nonvolatile memory device. The insulation layer 125 may electrically isolate the first conductive layer 128 from the substrate 100. The insulation layer may include an oxide such as silicon oxide. The insulation layer 125 may have a width substantially greater than that of the active region. The insulation layer 125 is formed on a center portion and edge portions of the active region.

Referring to FIG. 2, the insulation layer 125 includes a center portion and edge portions. The edge portions of the insulation layer 125 are formed on the edge portions of the active region. The center portion of the insulation layer 125 has a first thickness $D_1$, and each of the edge portions of the insulation layer 125 has a second thickness $D_2$. The first thickness $D_1$ is a distance between two points at which a line perpendicular to the center portion of the insulation layer 125 meets a bottom face and an upper face of the insulation layer 125. The second thickness $D_2$ is a distance between two points at which a line extended from the edge of the active region meets a bottom face and an upper face of the insulation layer 125. The second thickness $D_2$ is substantially the same as the first thickness $D_1$ or substantially thinner than the first thickness $D_0$.

Particularly, the edge portions of the insulation layer 125 are formed on upper edge portions of the active region. For example, each of the edge portions of the insulation layer 125 is formed on a portion at which a [100] plane of silicon and a [111] plane of silicon join. Because stress is concentrated on the upper edge portions of the active region, each of the edge portions of the insulation layer 125 may have a thickness smaller than that of the center portion of the insulation layer 125. In other words, when the insulation layer 125 is provided as a tunnel oxide layer, thinning of the tunnel oxide layer may be easily generated. When the tunnel oxide layer has a partially thin thickness, a Fowler-Nordheim (F-N) tunneling through the tunnel oxide layer may be concentrated on a thin portion of the tunnel oxide layer. Furthermore, electrons stored in a floating gate may easily leak through the thin portion of the tunnel oxide layer.

The compensation members 131 are formed on the edge portions of the insulation layer 125, respectively. Each of the compensation members 131 has a third thickness $D_3$. The third thickness $D_3$ is a distance between two points at which a line extended from the edge of the active region meets a bottom face and an upper face of each compensation member 131. The sum of the second thickness $D_2$ and the third thickness $D_3$ is substantially greater than the first thickness $D_1$. The compensation members 131 may include an insulation material. For example, the compensation members 131 include oxide that is formed by oxidation of lower edge portions of the first conductive layer 128. The compensation members 131 may complement the edge portions of the insulation layer 125 to prevent deterioration of the insulation layer 125. In particular, concentration of the F-N tunneling on the edge portions of the insulation layer 125 may be prevented, and generation of leakage current through the edge portions of the insulation layer 125 may be also inhibited.

The first conductive layer 128 is formed on the insulation layer 125. The first conductive layer 128 is also formed on the compensation members 131. The first conductive layer 128 may serve as a floating gate of a nonvolatile memory device. The first conductive layer may include a conductive material such as polysilicon doped with impurities. When the first conductive layer 128 is formed by a self-alignment process relative to a preliminary isolation layer having a protruded portion over the substrate 100, the first conductive layer 128 may have a width substantially greater than that of the active region.

In a flash memory device; a programming and an erasing are carried out by applying a proper voltage to a floating gate. The voltage applied to the floating gate is in proportion to a voltage applied to a control gate. The ratio between the floating gate voltage and the control gate voltage is referred to as a coupling ratio. As the coupling ratio increases, a programming efficiency may be enhanced. When the first conductive layer 128 has a width substantially greater than that of the active region, the coupling ratio of the flash memory device may be improved.

Lower edge portions of the first conductive layer 128 may be oxidized to form the compensation members 131. For example, when the first conductive layer 128 includes polysilicon doped with impurities, the compensation member 131 may include oxide of doped polysilicon.

The dielectric layer 137 is formed on the first conductive layer 128, and the second conductive layer 140 is formed on the dielectric layer 137. To enhance the coupling ratio of the nonvolatile memory device, the dielectric layer 137 may have a relatively thin thickness.

In one example embodiment of the present invention, the dielectric layer 137 may include an oxide/nitride/oxide (ONO) structure that has an oxide film, a nitride film formed on the oxide film and an additional oxide film formed on the nitride film. In another example embodiment of the present invention, the dielectric layer 137 may include a thin film having a high-k dielectric material. Examples of the high-k dielectric material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, etc. These can be used alone or in a mixture thereof. When the dielectric layer 137 includes the thin film having the high-k dielectric material, the dielectric layer 137 may further include an oxide film and a nitride film.

In an example embodiment of the present invention, the semiconductor device may further include a first oxide film (not shown) formed between the first conductive layer 128 and the dielectric layer 137. The first oxide film may include oxide formed by an oxidation of the first conductive layer. The first oxide film may serve as the dielectric layer 137. For example, when the dielectric layer 137 has an ONO structure, the first oxide film may be provided as a lower oxide film of the ONO structure.

The second conductive layer 140 is formed on the dielectric layer 137. The second conductive layer 140 may be provided as a control gate of a nonvolatile memory device. The second conductive layer 140 may include a conductive material. Examples of the conductive material may include polysilicon doped with impurities, a metal, a conductive metal nitride, a metal silicide, etc. Examples of the metal may include tungsten, titanium, tantalum, etc. Examples of the conductive metal nitride may include tungsten nitride, titanium nitride, tantalum nitride, etc. Examples of the metal silicide may include tungsten silicide, cobalt silicide, etc.

The second conductive layer 140 may have a single layer structure or a multi-layer structure. For example, when the second conductive layer 140 has the multi-layer structure, the second conductive layer 140 includes a first film having doped polysilicon and a second film having tungsten, tungsten silicide, tungsten nitride or titanium nitride. When the second conductive layer 140 includes a doped polysilicon layer, the doped polysilicon layer may be used as a hard mask in a patterning of the dielectric layer 137. Furthermore, the doped polysilicon layer may prevent a defect that may be generated in the dielectric layer 137 when a tungsten layer is formed directly on the dielectric layer 137.

The semiconductor device according to the present invention includes the compensation members 131 on the edge portions of the insulation layer 135 so that concentration of an F-N tunneling on the edge portions of the insulation layer 125 may be prevented, and generation of leakage current through the edge portions of the insulation layer 125 may be also inhibited. Furthermore, the semiconductor device may include the first conductive layer 128 having a width substantially greater than that of the active region of the substrate 100 so that a coupling ratio of a nonvolatile memory device may be enhanced. Therefore, the semiconductor device may have greatly improved electrical characteristics and reliability.

Method of Manufacturing a Semiconductor Device

FIGS. 3 to 8 and FIGS. 10 to 13 are cross-sectional views illustrating a method of manufacturing a semiconductor device in an example embodiment of the present invention.

Figure 3:
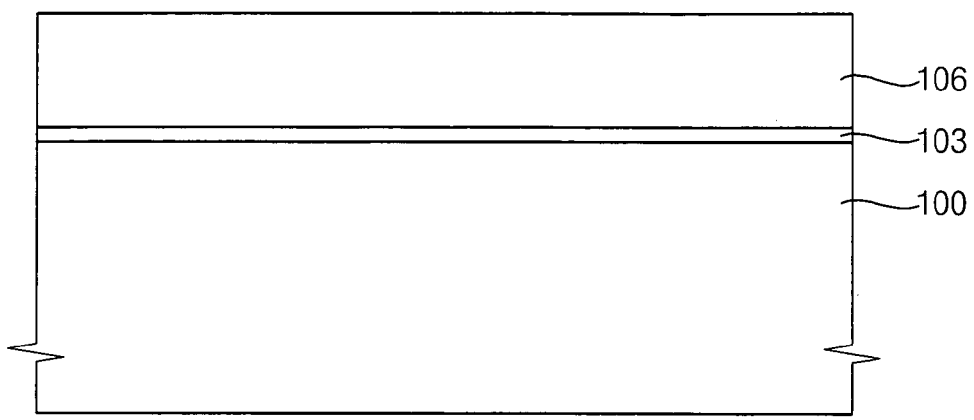
FIGS. 3 to 8 and FIGS. 10 to 13 are cross-sectional views illustrating a method of manufacturing a semiconductor device in an example embodiment of the present invention.

FIG. 3 is a cross-sectional view illustrating forming a pad oxide layer 103 and a first mask layer 106 on a substrate 100.

Referring to FIG. 3, the pad oxide layer 103 and the first mask layer 106 are successively formed on the substrate 100. The pad oxide layer 103 formed on the substrate 100 may prevent a defect generated on the substrate 100. For example, the pad oxide layer 103 is formed at a temperature of about 750° C. to about 900° C. When the pad oxide layer 103 is formed on the substrate 100, a surface of the substrate 100 may be thermally treated. The pad oxide layer 103 may be formed by a thermal oxidation process or a chemical vapor deposition (CVD) process. For example, the pad oxide layer 103 may have a thickness of about 70 Å to about 100 Å.

The first mask layer 106 is formed on the pad oxide layer 103. The first mask layer 106 may serve as an etching mask in an etching process for forming a trench 118 on the substrate 100. The first mask layer 106 may be formed using a nitride such silicon nitride, or an oxynitride such as silicon oxynitride. For example, the first mask layer 106 is formed using dichlorosilane ($SiH_2Cl_2$) gas, silane ($SiH_4$) gas or ammonia ($NH_3$) by a low-pressure chemical vapor deposition (LPCVD) process or a plasma-enhanced chemical vapor deposition (PECVD) process. The first mask layer 106 may have a sufficient thickness so that a preliminary isolation layer 119 (see FIG. 5) formed in a subsequent process may have a protruded upper portion. For example, the first mask layer 106 has a thickness of about 1,500 Å.

Figure 4:
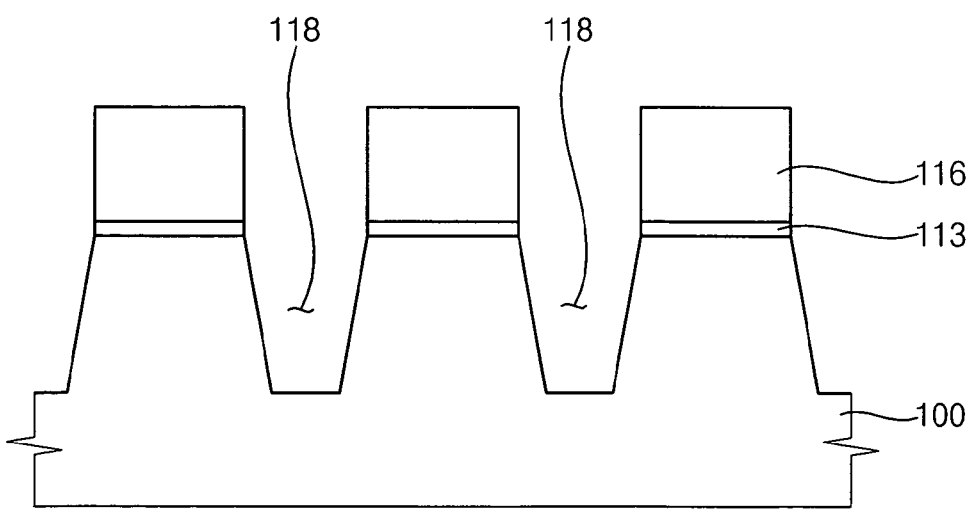

FIG. 4 is a cross-sectional view illustrating forming a pad oxide layer pattern 113, a first mask pattern 116 and trenches 118 on the substrate 100.

Referring to FIG. 4, a photoresist film (not shown) is formed on the first mask layer 106. The photoresist film is exposed to a light and developed using a developing solution to form a photoresist pattern (not shown) on the first mask layer 106.

The first mask layer 106 and the pad oxide layer 103 are successively etched using the photoresist pattern as an etching mask to form the first mask pattern 116 and the pad oxide layer pattern 113 on the substrate 100. The first mask pattern 116 and the pad oxide layer pattern 113 expose a portion of the substrate 100 at which the trenches 118 will be formed.

After the photoresist pattern is removed by an ashing process and/or a stripping process, the substrate 100 is partially etched using the first mask pattern 116 as an etching mask to form the trenches 118 in an upper portion of the substrate 100. For example, the substrate 100 is partially etched by a dry etching process using an etching gas that may be used for etching silicon.

Figure 5:
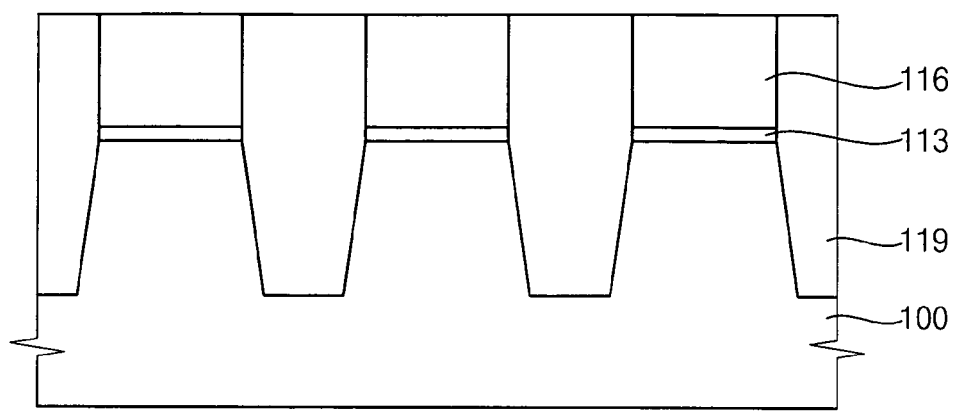

FIG. 5 is a cross-sectional view illustrating forming preliminary isolation regions 119 on the substrate 100.

Referring to FIG. 5, a field insulation layer is formed on the substrate 100 to fill up the trenches 118. The field insulation layer may be formed to cover the first mask pattern 116. An upper portion of the field insulation layer may be removed until an upper face of the first mask pattern 116 is exposed. As a result, the preliminary isolation regions 119 are formed to fill up the trenches 118. The field insulation layer may be formed using an oxide such as tetraethyl orthosilicate (TEOS), undoped silicate glass (USG), spin-on glass (SOG) or high-density plasma chemical vapor deposition (HDP-CVD) oxide. For example, the field insulation layer is formed by an HDP-CVD process using a plasma source including silane, oxygen and argon.

The field insulation layer is partially removed by a chemical mechanical polishing (CMP) process, an etch back process or a combination process of CMP and etch back. The field insulation layer is partially removed until an upper face of the first mask pattern 116 is exposed. A thickness of the first mask pattern 116 may not be substantially reduced by properly adjusting a condition of the removing process so that the preliminary isolation regions 119 have an upper portion protruded over the substrate 100.

The preliminary isolation regions 119 are formed on the substrate to fill up the trenches 118. As a result, an active region is defined on the substrate 100.

Figure 6:
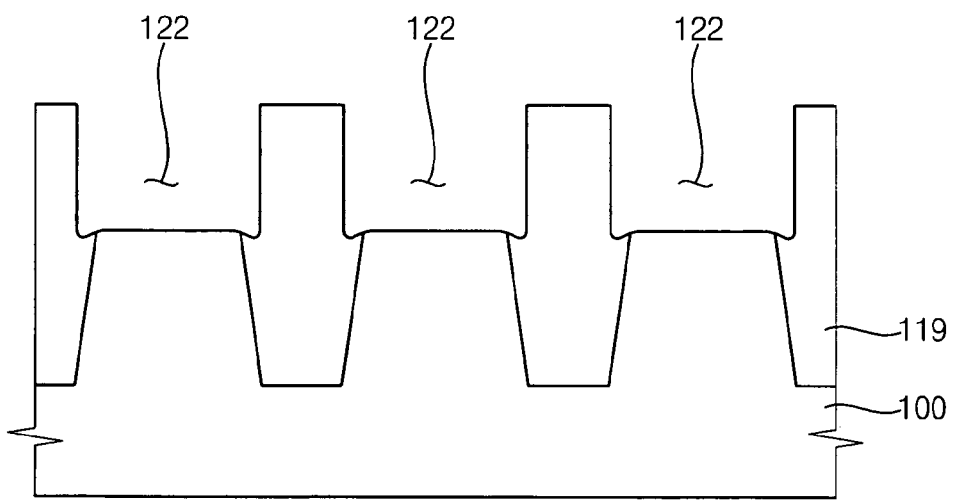

FIG. 6 is a cross-sectional view illustrating forming an opening 122 that exposes the active region.

Referring to FIG. 6, the first mask pattern 116 and the pad oxide layer pattern 113 are removed to form the opening 122 that exposes the active region of the substrate 100 between the preliminary isolation regions 119. As a result, the upper portions of the preliminary isolation regions 119 are protruded over the substrate 100. In particular, the first mask pattern 116 may be removed using a solution including phosphoric acid. The pad oxide layer pattern 113 may be removed using a solution including hydrogen fluoride. When the pad oxide layer pattern 113 is removed, sidewalls of the protruded upper portions of the preliminary isolation regions 119 may be partially removed by the solution including hydrogen fluoride. Accordingly, the opening 122 may be enlarged to have a width substantially greater than that of the active region of the substrate 100. Also, the opening 122 can be additionally enlarged using a solution including hydrogen fluoride in order to form an more enlarged transistor gate electrode.

As a result, the preliminary isolation regions 119 having protruded upper portions are formed on the substrate 100, and the opening 122 exposing the active region between the preliminary isolation regions 119 is formed.

Figure 7:
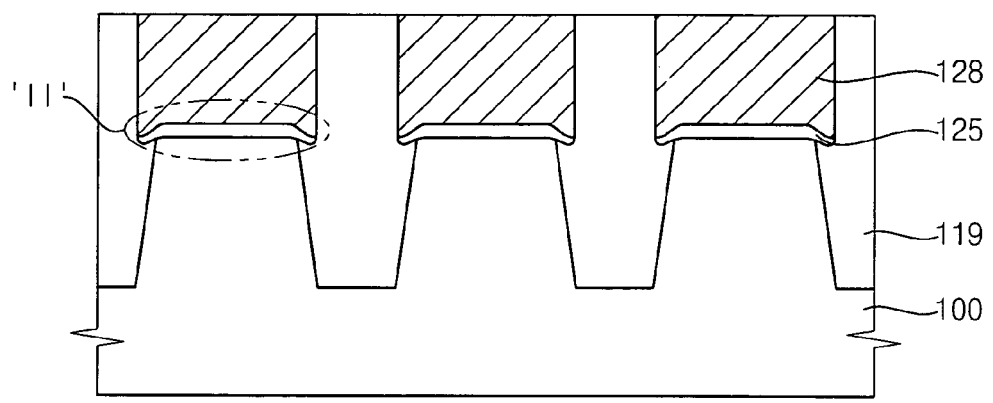

FIG. 7 is a cross-sectional view illustrating forming an insulation layer 125 and a first conductive layer 128 on the substrate 100 exposed between the preliminary isolation regions 119.

Referring to FIG. 7, the insulation layer 125 and the first conductive layer 128 are successively formed on the substrate 100 exposed between the preliminary isolation regions 119.

The insulation layer 125 is formed on the active region of the substrate 100. The insulation layer 125 may be formed by a thermal oxidation process or a chemical vapor deposition (CVD) process. For example, the insulation layer 125 is formed using silicon oxide, silicon oxide doped with fluorine, silicon oxide doped with carbon or a low dielectric constant (low-k) material. A thickness of the insulation layer 125 may be properly adjusted to characteristics of a transistor. For example, the insulation layer 125 has a thickness of about 50 Å to about 200 Å when the insulation layer 125 is applied to a cell transistor having a design rule smaller than about 100 nm.

The first conductive layer 128 is formed on the insulation layer 125. The first conductive layer 128 may be provided as a floating gate of a nonvolatile memory device. The first conductive layer 128 is self-aligned relative to the preliminary isolation regions 119. In particular, the opening 122 is filled with a conductive material to form a preliminary first conductive layer on the insulation layer 125. The preliminary first conductive layer is partially removed until upper faces of the preliminary isolation regions 119 are exposed. The preliminary first conductive layer is partially removed by a CMP process, an etch back process or a combination process of CMP and etch back. As a result, the first conductive layer 128 is formed on the insulation layer 125.

The opening 122 has a width substantially greater than that of the active region of the substrate 100 so that the first conductive layer 128 has a width substantially greater than that of the active region. Thus, the semiconductor device may have greatly enhanced coupling ratio.

The first conductive layer 128 may be formed using a conductive material such as polysilicon doped with impurities. For example, when the first conductive layer 128 is formed using polysilicon doped with impurities, the first conductive layer 128 is formed by a first process of depositing polysilicon and a second process of doping impurities. The first process may be preformed by thermally decomposing a silane-containing gas. Examples of the silane-containing gas may include about 100% silane gas or about 20% to about 30% of silane gas diluted with nitrogen gas. When the temperature of the first process is lower than about 450° C., the depositing rate of polysilicon may be excessively slow. In addition, when the temperature of the first process is higher than about 650° C., uniformity of a polysilicon layer thus formed may be poor and the silane-containing gas may be easily exhausted. Thus, the first process may be performed at a temperature of about 450° C. to about 650° C. When the first process is performed at the above temperature, the first process that is performed under a pressure of about 25 Pa to about 150 Pa is advantageous in terms of a depositing rate. The second process may be performed by a diffusion process or an ion implantation process, or by an in situ doping process with the first process.

Figure 8:
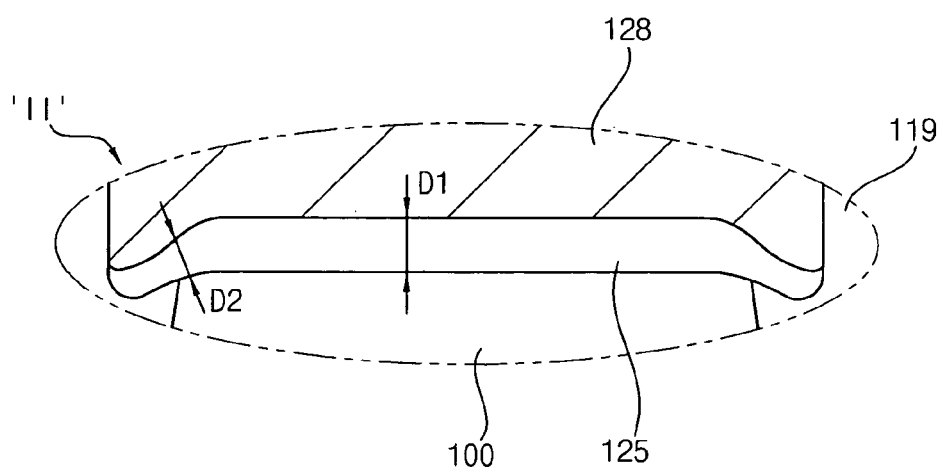

FIG. 8 is a partially enlarged cross-sectional view of a portion of "II" in FIG. 7.

Referring to FIG. 8, edge portions of the insulation layer 125 have a second thickness $D_2$ substantially the same as or thinner than a first thickness $D_1$ of a center portion of the insulation layer 125. In particular, the center portion of the insulation layer 125 may be formed on a [100] plane of silicon. The edge portions of the insulation layer 125 may be formed on edges of the active region at which a [100] plane of silicon and a [111] plane of silicon join. The number of a dangling bond in a [111] plane is relatively greater than that of a dangling bond in a [100] plane. Because of a difference of the number of a dangling bond, stress may be concentrated on the edge portions of the active region at which the [100] plane and the [111] plane join. Thus, the insulation layer 125 formed on the edge portions of the active region may have a thickness substantially smaller than that of the insulation layer 125 formed on the [100] plane of the active region. As a result, the second thickness $D_2$ of the insulation layer 125 may be substantially smaller than the first thickness $D_1$ of the insulation layer 125. For example, the second thickness D2 is a half of the first thickness D1.

Figure 9:
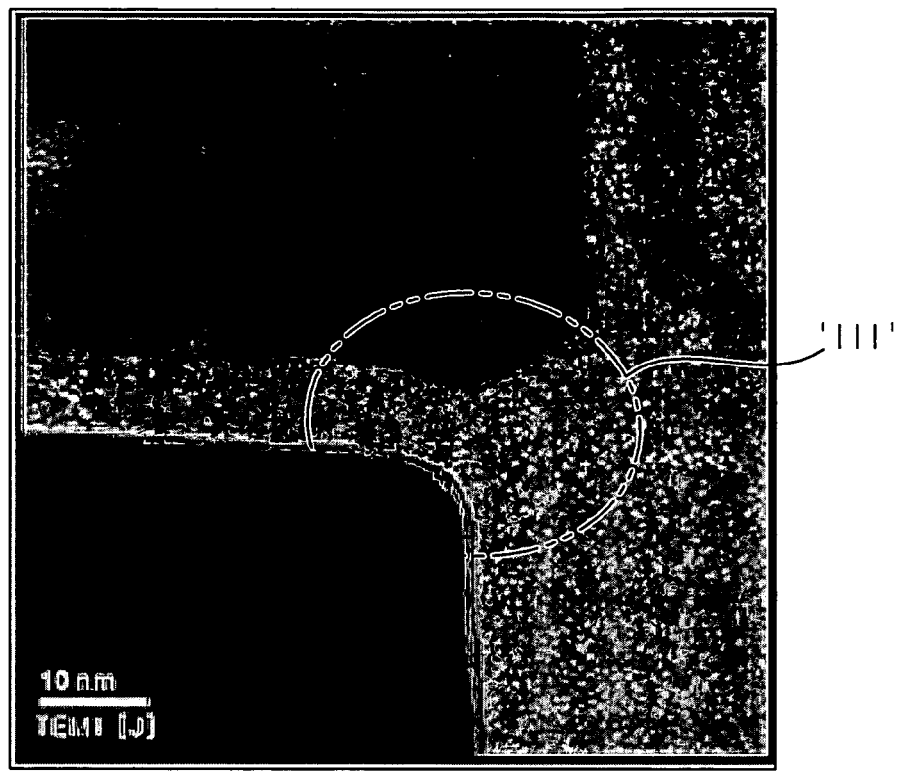
FIG. 9 is a transmission electron microscope (TEM) image showing thinning of edge portions of an insulation layer.

FIG. 9 is a transmission electron microscope (TEM) picture showing the thinning of the edge portions of the insulation layer 125.

Referring to FIG. 9, the edge portions of the insulation layer 125 are formed on the edges of the active region. The edge portions of the insulation layer 125 are shown in a portion of "III" in FIG. 9. The edge portions of the insulation layer 125 have a thickness relatively smaller than that of the center portion of the insulation layer 125. The thinning of the edge portions of the insulation layer 125 may be generated from the stress concentrated on the edges of the active region. When the thinning of the edge portions of the insulation layer 125 is generated, a Fowler-Nordheim (F-N) tunneling through the insulation layer 125 may be concentrated on the edge portions of the insulation layer 125, and the electrons on a floating gate formed on the insulation layer 125 may easily leak through the edge portions of the insulation layer 125. Thus, electrical characteristics of the insulation layer 125 may be deteriorated, and reliability of the semiconductor device may be reduced. To overcome the above problems, compensation members 131 (see FIG. 11) are formed on the edge portions of the insulation layer 125 in a subsequent process.

Figure 10:
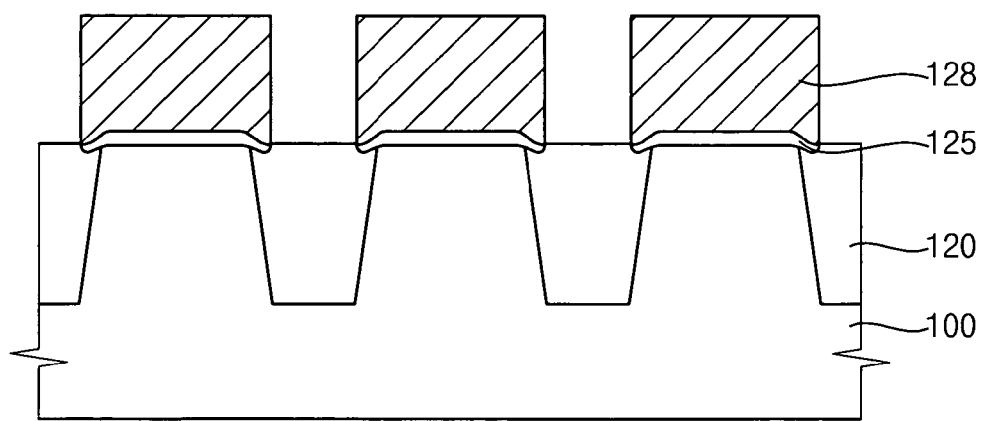

FIG. 10 is a cross-sectional view illustrating forming isolation regions 120 on the substrate 100.

Referring to FIG. 10, a second mask pattern (not shown) is formed on the first conductive layer 128. The second mask pattern may serve as an etching mask in an etching process for removing the protruded upper portions of the preliminary isolation regions 119. The second mask pattern may be formed using a nitride such as silicon nitride or an oxynitride such as silicon oxynitride.

The protruded portions of the preliminary isolation regions 119 are removed to form the isolation regions 120 on the substrate 100 and to expose sidewalls of the first conductive layer 128. At this moment, all of the first conductive layer's sidewall may be exposed in order to readily form compensation members at the next step. The protruded portions of the preliminary isolation regions 119 are removed using the second mask pattern as an etching mask by an isotropic etching process or an anisotropic etching process. The edge portions of the insulation layer 125 may not be exposed in the etching process by properly adjusting the conditions of the etching process. Thus, damage to the insulation layer 125 in the etching process may be prevented.

After a formation of the isolation regions 120, the second mask pattern is removed. The second mask pattern may be removed by a stripping process using a solution including phosphoric acid.

Figure 11:
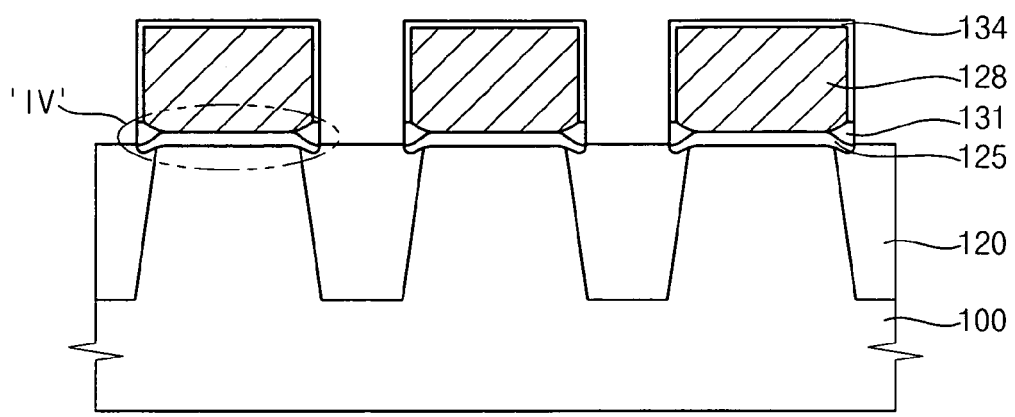

FIG. 11 is a cross-sectional view illustrating forming compensation members 131 on the edge portions of the insulation layer 125.

Referring to FIG. 11, a first oxide film 134 is formed on the conductive layer 128 and the compensation members 131 are formed on the edge portions of the insulation layer 125 by an oxidation process. The compensation members 131 may be formed by oxidation of lower edge portions of the first conductive layer 128. Thus, the compensation members 131 may include an oxide of a conductive material.

The oxidation process may be performed by a dry oxidation process or a wet oxidation process. The dry oxidation process may be carried out under an atmosphere including oxygen. The dry oxidation process may be performed at a temperature of about 800° C. to about 1,100° C. The wet oxidation process may be carried out under an atmosphere including hydrogen, hydrogen chloride or nitrogen oxide with oxygen. Examples of the nitrogen oxide may include nitrous oxide ($N_2O$), nitric oxide (NO) and the like. These can be used alone or in a mixture thereof. The wet oxidation process may be performed at a temperature of about 800° C. to about 1,100° C. An oxidation rate of the wet oxidation process may be controlled by changing a partial pressure of oxygen relative to hydrogen, hydrogen chloride or nitrogen oxide. The oxidation process may be performed using a batch-type apparatus or a single-type apparatus.

The oxidation process may be performed by a thermal oxidation process, a radical oxidation process or a plasma oxidation process. The thermal oxidation process may be carried out at a temperature of about 800° C. to about 1,100° C. under an atmosphere including oxygen. The thermal oxidation process may be performed by the dry oxidation process or the wet oxidation process.

For example, the thermal oxidation process is performed using a batch-type oxidation apparatus at a temperature of about 850° C. A flow rate of oxygen gas is about 10 standard liters per minute (slm). A growth rate of oxide is about 75 Å/min based silicon oxide that grows on a bare silicon wafer.

The radical oxidation process may be performed using an activated gas in a radical state. The activated gas in a radical state may enhance a reaction rate of oxidation, and may uniformly oxidize a surface of an object irrespective of a shape of the object. Thus, the first oxide film 134 may be formed on the first conductive layer 128 by the radical oxidation process within a relatively short time, and the compensation members 131 may be formed on the edge portions of the insulation layer 125. The radical oxidation process may be carried out using oxygen, or using hydrogen, hydrogen chloride or nitrogen oxide with oxygen. The radical oxidation process may be performed at a temperature of about 800° C. to about 1,100° C. The radical oxidation process may be performed using a batch-type apparatus or a single-type apparatus.

For example, the radical oxidation process is performed using a batch-type oxidation apparatus at a temperature of about 900° C. under an atmosphere including oxygen gas and hydrogen gas. A flow rate of oxygen gas is about 2 slm, and a flow rate of hydrogen gas is about 0.2 slm. An inner pressure of the oxidation apparatus is maintained under a pressure of about 0.5 Torr. A growth rate of oxide is about 75 Å/min based silicon oxide that grows on a bare silicon wafer.

The plasma oxidation process may be performed using oxygen plasma. A gas including oxygen may be introduced into a container, and may be activated into a plasma state. The gas may further include hydrogen, hydrogen chloride or nitrogen oxide with oxygen. The gas may be activated by applying a power of about 1,000 W to about 5,000 W under a pressure of about 1 mTorr to about 10 Torr. The plasma oxidation process may be performed at a temperature of about 350° C. to about 800° C. In an example embodiment of the present invention, an inactive gas may be used for rapidly generating plasma. An example of the inactive gas may include argon gas.

For example, the plasma oxidation process is performed using a single-type oxidation apparatus at a temperature of about 400° C. Oxygen gas, hydrogen gas and argon gas are introduced into the oxidation apparatus. A flow rate of oxygen gas is about 2.5 standard cubic centimeters per minute (sccm), a flow rate of hydrogen gas is about 5 sccm, and a flow rate of argon gas is about 500 sccm. Plasma is generated by applying a power of about 2,700 W under a pressure of about 2 Torr. A growth rate of oxide is about 75 Å/min based silicon oxide that grows on a bare silicon wafer.

Through the above oxidation process, the compensation members 131 may be formed by oxidation of lower edge portions of the first conductive layer 128, and the first oxide film 134 is formed on the first conductive layer 128. For example, when the first conductive layer 128 is formed using polysilicon doped with impurities, the compensation members 131 and the first oxide film 134 may include oxide of doped polysilicon.

Figure 12:
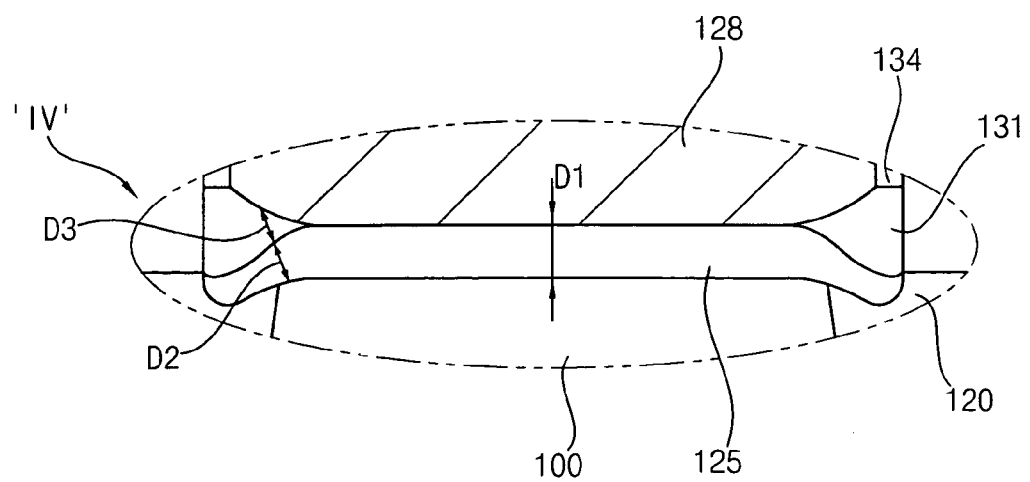

FIG. 12 is a partially enlarged cross-sectional view illustrating a portion of "IV" in FIG. 11.

Referring to FIG. 12, the compensation members 131 are formed on the edge portions of the insulation layer 125 by the oxidation process. As described with reference to FIG. 2, the insulation layer 125 includes a center portion having a first thickness $D_1$, and edge portions each having a second thickness $D_2$. Each of the compensation members has a third thickness $D_3$. A sum of the second thickness $D_2$ and the third thickness $D_3$ may be substantially greater than that of the first thickness $D_1$.

The compensation members 131 may be formed using an insulation material so that the compensation members 131 may complement the insulation layer 125 to improve electrical characteristics of the semiconductor device.

In one example embodiment of the present invention, the first oxide film 134 may be removed. The first oxide film 134 may be removed by an isotropic etching process or an anisotropic etching process. The insulation layer 125, the compensation members 131 and the first conductive layer 128 may not be damaged in the etching process by properly adjusting the etching process condition.

In another example embodiment of the present invention, the first oxide film 134 may not be removed. The first oxide film 134 may serve as a portion of a dielectric layer 137 (see FIG. 13) subsequently formed on the first conductive layer 128. For example, when the dielectric layer 137 has an ONO structure including an oxide film, a nitride film and an additional oxide film, the first oxide film 134 may be provided as the oxide film of the ONO structure.

Figure 13:
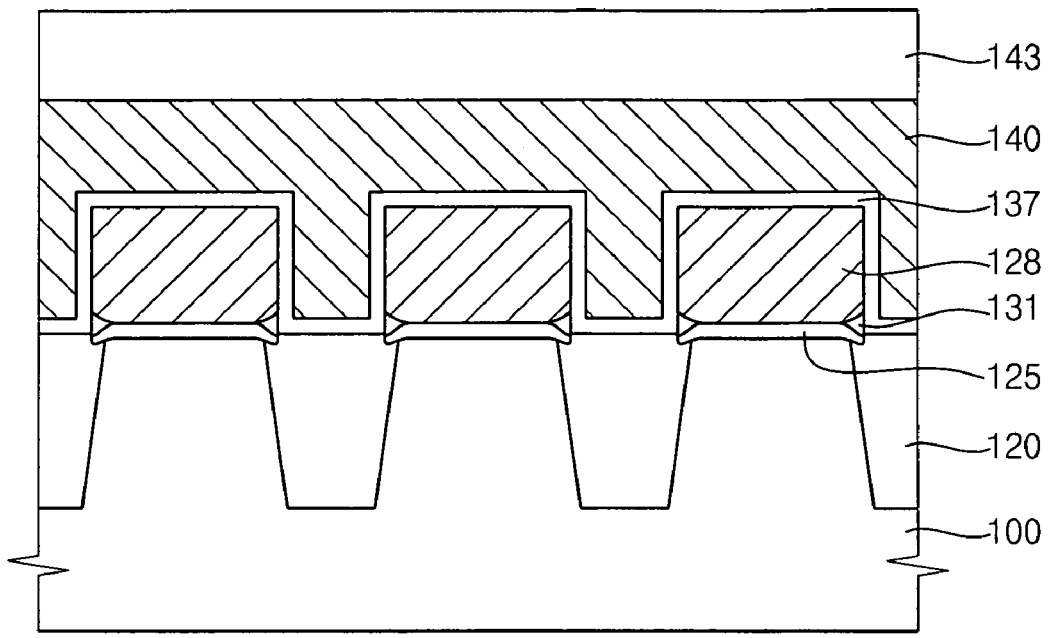

FIG. 13 is a cross-sectional view illustrating forming a dielectric layer 137, a second conductive layer 140, and a third mask layer 143 on the first conductive layer 128.

Referring to FIG. 13, the dielectric layer 137 is formed on the first conductive layer 128. The dielectric layer 137 may be formed by a sputtering process, a chemical vapor deposition (CVD) process or an atomic layer deposition (ALD) process.

The dielectric layer 137 may have a single layer structure or a multi-layer structure. In one example embodiment of the present invention, the dielectric layer 137 may be formed using a high dielectric constant (high-k) material. In another example embodiment of the present invention, the dielectric layer 137 may have an ONO structure including an oxide film, a nitride film and an additional oxide film. In still another example embodiment of the present invention, the dielectric layer 137 may have a multi-layer structure including a silicon oxide film, a silicon nitride film and a high-k thin film. Examples of the high-k material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, etc. These can be used alone or in a mixture thereof.

The second conductive layer 140 is formed on the dielectric layer 137. The second conductive layer 140 may be provided as a control gate of a nonvolatile memory device. The second conductive layer 140 may be formed using a conductive material such as polysilicon doped with impurities, metal, conductive metal nitride, metal silicide, etc. The second conductive layer 140 may have a single layer structure or a multi-layer structure. The second conductive layer 140 may be formed by a sputtering process, a CVD process or an ALD process.

The third mask layer 143 is formed on the second conductive layer 140. The third mask layer 143 may be formed using a nitride such as silicon nitride. The third mask layer 143 may be partially removed by a photolithography process to form a third mask pattern (not shown). The third mask pattern may be formed at a right angle to the active region of the substrate 100.

The second conductive layer 140, the dielectric layer 137, the first conductive layer 128, the compensation members 131, and the insulation layer 125 are successively etched using the third mask pattern as an etching mask to form a gate structure (not shown) on the substrate 100. The gate structure includes an insulation layer pattern, compensation member patterns, a first conductive layer pattern, a dielectric layer pattern, a second conductive layer pattern, and the third mask pattern.

A nitride layer (not shown) may be formed on the gate structure using a nitride such as silicon nitride. The nitride layer may be anisotropically etched to form a gate spacer (not shown) on a sidewall of the gate structure. The gate structure may be electrically isolated from an adjacent gate structure by the gate spacer.

A source/drain region and a wiring may be formed through an ordinary process to complete a semiconductor device such as a nonvolatile memory device.

According to the present invention, compensation members formed on edge portions of an insulation layer may prevent an F-N tunneling from being concentrated on the edge portions of the insulation layer, and may also prevent generation of leakage current through the edge portions of the insulation layer. Furthermore, a first conductive layer may have a width substantially greater than that of an active region of a substrate so that a coupling ratio of a nonvolatile memory device may be enhanced. Therefore, electrical characteristics and reliability of a semiconductor device may be greatly improved.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device comprising:
   forming preliminary isolation regions on a substrate to define an active region, the preliminary isolation regions having protruded upper portions;
   forming an insulation layer on a portion of the active region exposed between the preliminary isolation regions;
   forming a first conductive layer on the insulation layer to fill a space between the protruded upper portions of the preliminary isolation regions;
   removing the protruded upper portions of the preliminary isolation regions to expose sidewalls of the first conductive layer; and
   forming compensation members on edge portions of the insulation layer to have a thickness sufficient for preventing concentration of a Fowler-Nordheim tunneling through the edge portions of the insulation layer by oxidizing exposed lower edge portions of the first conductive layer.

2. The method of claim 1, wherein forming the preliminary isolation regions comprises:
   successively forming a pad oxide layer and a mask layer on the substrate;
   partially etching the mask layer and the pad oxide layer to form a pad oxide layer pattern and a mask pattern on the substrate and to expose portions of the substrate;
   partially etching the exposed portions of the substrate to form trenches on the substrate;
   filling a preliminary isolation layer into the trenches to form the preliminary isolation regions; and
   removing the mask pattern and the pad oxide layer pattern to form an opening exposing the active region between the preliminary isolation regions.

3. The method of claim 2, further comprising enlarging the opening so that the opening has a width substantially greater than that of the active region.

4. The method of claim 3, wherein the insulation layer formed on a bottom of the opening has a width substantially greater than that of the active region.

5. The method of claim 4, wherein the first conductive layer has a width substantially greater than that of the active region.

6. The method of claim 1, wherein the compensation members are formed by a dry oxidation process or a wet oxidation process.

7. The method of claim 6, wherein the compensation members are formed by a thermal oxidation process, a radical oxidation process, or a plasma oxidation process.

8. The method of claim 7, wherein the thermal oxidation process and the radical oxidation process are performed at a temperature of about 800° C. to about 1100° C.

9. The method of claim 7, wherein the plasma oxidation process is performed at a temperature of about 350° C. to about 800° C.

10. The method of claim 1, wherein a first oxide film is formed on the first conductive layer while the compensation members are formed at the lower edge portions of the first conductive layer.

11. The method of claim 1, further comprising:
    forming a dielectric layer on the first conductive layer; and
    forming a second conductive layer on the dielectric layer.

12. The method of claim 10, further comprising:
    forming a nitride film on the first oxide film; and
    forming a second oxide film on the nitride film.

13. The method of claim 10, further comprising:
    removing the first oxide film;
    forming a dielectric layer on the first conductive layer; and
    forming a second conductive layer on the dielectric layer.

14. The method of claim 1, wherein the protruded upper portions of the preliminary isolation regions are removed until all of the sidewalls and lower edge portions of the first conductive layer are exposed.

* * * * *

UNITED STATES PATENT AND TRADEMARK OFFICE
CERTIFICATE OF CORRECTION

PATENT NO. : 7,608,509 B2 Page 1 of 1
APPLICATION NO. : 11/494439
DATED : October 27, 2009
INVENTOR(S) : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 440 days.

Signed and Sealed this

Twelfth Day of October, 2010

David J. Kappos
*Director of the United States Patent and Trademark Office*